US009111888B2

(12) United States Patent
Do et al.

(10) Patent No.: US 9,111,888 B2
(45) Date of Patent: Aug. 18, 2015

(54) ORGANIC LIGHT EMITTING DIODE DISPLAY DEVICE (71) Applicant: LG Display Co., Ltd., Seoul (KR)

(72) Inventors: Eui-Doo Do, Goyang-si (KR); Min-Ki Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/445,180

(22) Filed: Jul. 29, 2014

(65) Prior Publication Data

US 2015/0144902 A1 May 28, 2015

(30) Foreign Application Priority Data

Nov. 28, 2013 (KR) .................. 10-2013-0146277

(51) Int. Cl.
*H01L 29/08* (2006.01)
*H01L 27/32* (2006.01)
*H01L 51/52* (2006.01)

(52) U.S. Cl.
CPC ........ *H01L 27/3246* (2013.01); *H01L 27/3262* (2013.01); *H01L 51/5203* (2013.01); *H01L 51/5228* (2013.01); *H01L 51/5271* (2013.01)

(58) Field of Classification Search
CPC ............ H01L 27/3246; H01L 27/3253; H01L 27/3283
See application file for complete search history.

(56) References Cited

U.S. PATENT DOCUMENTS

| 2005/0051776 A1* | 3/2005 | Miyagi et al. .................. 257/72 |
| 2008/0157655 A1* | 7/2008 | Choi et al. .................... 313/504 |
| 2011/0228144 A1* | 9/2011 | Tian et al. ..................... 348/243 |
| 2013/0056784 A1* | 3/2013 | Lee et al. ....................... 257/99 |

* cited by examiner

*Primary Examiner* — Whitney T Moore
*Assistant Examiner* — Joseph Galvin, III
(74) *Attorney, Agent, or Firm* — Fenwick & West LLP (57) ABSTRACT An organic light emitting diode display device includes: a reflective electrode and an auxiliary electrode; a bank layer on the reflective electrode and the auxiliary electrode, the bank layer including a first open portion and a second open portion exposing a portion of the reflective electrode and a portion of the auxiliary electrode, respectively; a separator on the auxiliary electrode, the separator disposed within the second open portion; a pixel electrode in contact with the portion of the reflective electrode exposed by the first open portion of the bank layer, the pixel electrode being disposed separated from the separator; an organic emission layer on the pixel electrode, the organic emission layer divided by the separator, the organic emission layer being disposed separated from the separator; and a common electrode on the organic emission layer, the common electrode connected to the auxiliary electrode.

25 Claims, 6 Drawing Sheets

ORGANIC LIGHT EMITTING DIODE DISPLAY DEVICE

CROSS-REFERENCE TO RELATED APPLICATIONS

The present application claims the benefit of priority of Korean Patent Application No. 10-2013-0146277 filed on Nov. 28, 2013, which is hereby incorporated by reference for all purposes as if fully set forth herein.

BACKGROUND

1. Field

The present disclosure relates to an organic light emitting diode display device. The present disclosure also relates to an active matrix organic light emitting diode display device.

2. Discussion of the Related Art

Recently, flat panel display (FPD) technology has developed to produce FPDs that are light weight and thin. Among various FPDs, organic light emitting diode (OLED) display devices are considered as a next generation display device following a liquid crystal display (LCD.

Since the OLED display devices do not need backlight (unlike LCD devices), the OLED display device has an advantage of more applications compared to the LCD device. Specifically, the OLED display device is better for transparent displays or flexible displays.

The OLED display device may be classified into two types according to an emission direction: a bottom emission type where a light is emitted toward a lower portion through a substrate having a driving circuit thereon; and a top emission type where a light is emitted toward an upper portion opposite to a substrate having a driving circuit thereon. For the purpose of obtaining a high resolution OLED display device including a flexible display and for the purpose of improving an aperture ratio and transparency of a transparent display, the top emission type OLED display device where the driving circuit does not have an influence on aperture ratio has been the recent focus.

In the OLED display device, an anode of a lower electrode functions as a pixel electrode in a pixel region and a cathode of an upper electrode functions as a common electrode over an entire surface of a substrate. As a result, light emitted from an organic material layer passes through the anode in the bottom emission type OLED display device, and a light emitted from an organic material layer passes through the cathode in the top emission type OLED display device.

Since the anode is generally formed of a transparent conductive oxide and the cathode is generally formed of a metal, the metal for the cathode is formed as a thin film to increase a transmittance in the top emission type OLED display device.

However, as a thickness of the thin film for the cathode decreases, a resistance of the cathode increases and brightness is reduced at a central portion of an image. In addition, as a thickness of the thin film for the cathode increases, a transmittance of the cathode decreases and light emission efficiency is reduced.

SUMMARY

An organic light emitting diode display device includes: a reflective electrode and an auxiliary electrode; a bank layer on the reflective electrode and the auxiliary electrode, the bank layer including a first open portion and a second open portion exposing a portion of the reflective electrode and a portion of the auxiliary electrode, respectively; a separator on the auxiliary electrode, the separator disposed within the second open portion; a pixel electrode in contact with the portion of the reflective electrode exposed by the first open portion of the bank layer, the pixel electrode being disposed separated from the separator; an organic emission layer on the pixel electrode, the organic emission layer divided by the separator, the organic emission layer being disposed separated from the separator; and a common electrode on the organic emission layer, the common electrode connected to the auxiliary.

In another aspect, an organic light emitting diode display device includes: a pixel electrode and an auxiliary electrode; a bank layer on the pixel electrode and the auxiliary electrode, the bank layer including a first open portion and a second open portion exposing a portion of the pixel electrode and a portion of the auxiliary electrode, respectively; a separator in contact with the auxiliary electrode, the separator disposed within the second open portion; an organic emission layer in contact with the pixel electrode at the first open portion, the organic emission layer being disposed separated from the separator; and a common electrode on the organic emission layer, the common electrode connected to the auxiliary electrode.

In another aspect, an organic light emitting diode display device includes: a pixel electrode; an auxiliary electrode; a bank layer over both of the pixel electrode and the auxiliary electrode, the bank layer defining: a first opening exposing a portion of the pixel electrode; a second opening exposed a portion of the auxiliary electrode; an organic emission layer in contact with the pixel electrode in the first opening; and a common electrode over the organic emission layer and in contact with the auxiliary electrode in the second opening, the auxiliary electrode reducing an electrical resistance of the common electrode.

It is to be understood that both the foregoing general description and the following detailed description are exemplary and explanatory and are intended to provide further explanation of the embodiments as claimed.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure. In the drawings.

DETAILED DESCRIPTION OF THE ILLUSTRATED EMBODIMENTS

Reference will now be made in detail to the preferred embodiments, examples of which are illustrated in the accompanying drawings.

Figure 1:
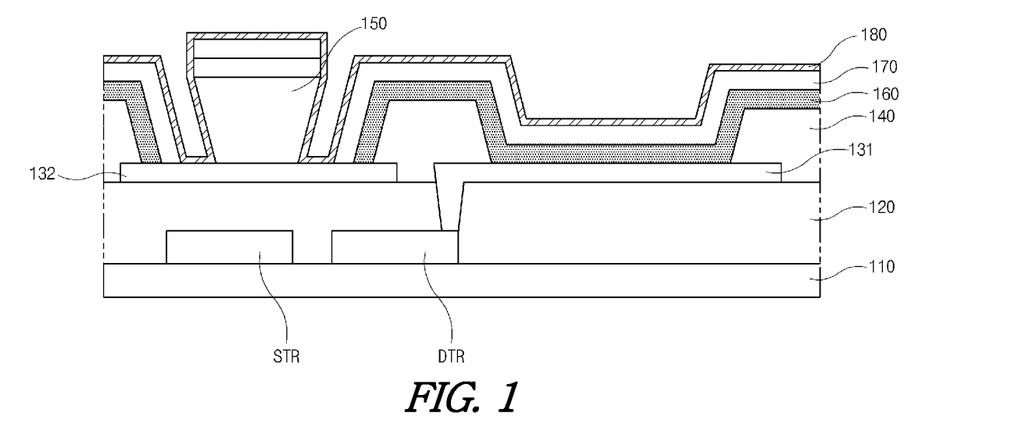
FIG. 1 is a cross-sectional view showing a top emission type organic light emitting diode display device according to a first embodiment of the present disclosure.

FIG. 1 is a cross-sectional view showing a top emission type organic light emitting diode display device according to a first embodiment of the present disclosure.

In FIG. 1, a top emission type organic light emitting diode (OLED) display device includes a substrate 110, a switching transistor STR, a driving transistor DTR, a planarization layer 120, a reflective electrode 131, an auxiliary electrode 132, a separator 150, a pixel electrode 160, an organic emission layer 170 and a common electrode 180.

The substrate 110 may include one of a glass, a metal and a plastic. In addition, the substrate 110 may include a flexible material such as polyethersulfone (PES), polyacrylate (PAR), polyetherimide (PEI), polyethylene naphthalate (PEN), polyethylene terephthalate (PET), polyphenylene sulfide (PPS), polyacrylate, polyimide (PI), polycarbonate (PC), cellulose triacetate (TAC) and cellulose acetate propionate (CAP).

The switching transistor STR and the driving transistor DTR are formed on the substrate 110. The switching transistor STR includes a gate electrode (not shown) connected to a gate line (not shown), a source electrode (not shown) connected to a data line (not shown) and a drain electrode. A gate signal of the gate line is applied to the gate electrode of the switching transistor STR to turn of the switching transistor STR. When the switching transistor STR is turned on by the gate signal, a data signal of the data line is transmitted from the source electrode to the drain electrode of the switching transistor STR. In addition, the data signal of the drain electrode of the switching transistor STR is transmitted to a gate electrode (not shown) of the driving transistor DTR. The driving transistor DTR transmits one of a high level voltage Vdd of a power voltage and a low level voltage Vss of the power voltage to the reflective electrode 131 through a drain electrode (not shown) of the driving transistor DTR according to the data signal.

The high level voltage Vdd may be referred to as a drain voltage, and the low level voltage Vss may be referred to as a source voltage. Since the names of drain and source are variable according to the kind of the transistor and the driving method, the drain voltage having a relatively higher voltage may be referred to as the high level voltage Vdd and the source voltage having a relatively lower voltage may be referred to as the low level voltage Vss.

The planarization layer 120 is formed on the switching transistor STR and the driving transistor DTR. The planarization layer 120 planarizes the unevenness of the switching transistor STR and the driving transistor DTR to improve a structural stability for an organic light emitting diode on the planarization layer 120.

In addition, the planarization layer 120 may include an organic material such as acrylic resin (e.g., polyacrylate resin), epoxy resin, phenolic resin, polyamide resin, polyimide resin, unsaturated polyester resin, polyphenylene ether resin, polyphenylene sulfide resin, photo acryl and benzocyclobutene (BCB).

A passivation layer (not shown) of an inorganic material such as silicon oxide (SiOx) and silicon nitride (SiNx) may be formed between the switching and driving transistors STR and DTR and the planarization layer 120.

The reflective electrode 131 and the auxiliary electrode 132 are formed on the planarization layer 120 and are spaced apart from each other. The reflective electrode 131 is connected to the driving transistor DTR and the low level voltage Vss of the power voltage is supplied to the reflective electrode 131 through the driving transistor DTR according to the data signal. The reflective electrode 131 transmits the low level voltage Vss to the pixel electrode 160.

The reflective electrode 131 may reflect a light emitted from the organic emission layer 170 toward the common electrode 180 to improve brightness due to increase in amount of light. In addition, the reflective electrode 131 may be formed to have a micro-cavity structure with the common electrode 180 to further improve brightness due to amplification of the light between the reflective electrode 131 and the common electrode 180.

The reflective electrode 131 may include a material having a relatively high reflectance such as a metallic material for reflecting the light emitted from the organic emission layer 170. For example, the reflective electrode 131 may include at least one of molybdenum (Mo), aluminum (Al), silver (Ag), chromium (Cr), gold (Au), titanium (Ti), nickel (Ni), neodymium (Nd) and copper (Cu) and an alloy having at least one thereof In addition, the reflective electrode 131 may have a single layer or multiple layers.

The auxiliary electrode 132 may be coplanar with the reflective electrode 131. In addition, the auxiliary electrode 132 may be formed together with the reflective electrode 131 to have the same material as at least one of the materials for the reflective electrode 131. The auxiliary electrode 132 is connected to the common electrode 180 to reduce the resistance of the common electrode 180.

Since the auxiliary electrode 132 is connected to the common electrode 180, the auxiliary electrode 132 has the same voltage as the common electrode 180. When the common electrode 180 is a cathode, the low level voltage Vss may be supplied to the auxiliary electrode 132. In addition, when the common electrode 180 is an anode, the high level voltage Vdd may be supplied to the auxiliary electrode 132. In the first embodiment of FIG. 1, since the common electrode 180 functions as an anode, the high level voltage Vdd is supplied to the auxiliary electrode 132 and the auxiliary electrode 132 is connected to the common electrode 180 to reduce a resistance of the common electrode 180.

The bank layer 140 is formed on the reflective electrode 131 and the auxiliary electrode 132. The bank layer 140 overlaps and covers an edge portion of each of the reflective electrode 131 and the auxiliary electrode 132 to have open portions exposing the reflective electrode 131 and the auxiliary electrode 132. The pixel electrode 160 and organic emission layer 170 are sequentially formed on the reflective electrode 131 exposed through the open portions and on the bank layer 140. In addition, the separator 150 is formed on the auxiliary electrode 132 exposed through the open portions.

The bank layer 140 may include one of an organic material and an inorganic material. For example, the bank layer 140 may include an organic material such as benzocyclobutene (BCB) resin, acrylic resin and polyimide resin, or an inorganic material such as silica.

The separator 150 is spaced apart from the bank layer 140 to provide a space for connection of the common electrode 180 and the auxiliary electrode 132. In addition, the separator 150 may have a reverse taper shape wherein a top width is greater than a bottom width to prevent deposition of materials, which has a poor step coverage property, for the pixel electrode 131 and the organic emission layer 170 on the auxiliary electrode 132 exposed between the separator 150 and the bank layer 140. As a result, the common electrode 180 is connected directly to the auxiliary electrode 132.

The separator 150 may include the same material as the bank layer 140 to improve process efficiency. Alternatively, the separator 150 may include a negative type photoresist so that the reverse taper shape can be easily obtained.

The separator 150 may divide each of the pixel electrode 160 and the organic emission layer 170 by pixel region such that each of the pixel electrode 160 and the organic emission layer 170 is divided in a gap between the separator 150 and the bank layer 140. The pixel electrode 160 and the organic emission layer 170 may be formed on the separator 150. Since each of the pixel electrode 160 and the organic emission layer 170 is divided by the separator 150 through a deposition step without an additional patterning step due to a poor step coverage property, the process efficiency of the OLED display device is improved.

The pixel electrode 160 is formed on the reflective electrode 131 and the bank layer 140 and is separated from the auxiliary electrode 132. An edge portion of the pixel electrode 160 is completely covered with the organic emission layer 170 such that the pixel electrode 160 is not electrically connected to the common electrode 180.

The pixel electrode 160 may be an anode or a cathode. In the first embodiment of FIG. 1, since the pixel electrode 160 functions as a cathode, the pixel electrode 160 supplies an electron to the organic emission layer 170. As a result, the pixel electrode 160 may include a material having a relatively low work function.

The pixel electrode 160 may have a single layer or multiple layers including at least one of silver (Ag), magnesium (Mg), calcium (Ca), aluminum (Al), lithium (Li) and neodymium (Nd). Alternatively, the pixel electrode 160 may have a single layer or multiple layers such as lithium fluoride/aluminum (LiF/Al), cesium fluoride/aluminum (CsF/Al), magnesium silver (Mg:Ag), calcium/silver (Ca/Ag), calcium silver(Ca:Ag), lithium fluoride/magnesium silver (LiF/Mg:Ag), lithium fluoride/calcium/silver (LiF/Ca/Ag) and lithium fluoride/calcium silver (LiF/Ca:Ag). Since a work function of the metal is lower than a work function of the conductive oxide, the pixel electrode 160 of multiple layers may include a metal layer contacting the organic emission layer 170 to supply the electron to the organic emission layer 170 easily. In addition, since the light of the organic emission layer 170 is emitted through the common electrode 180, the pixel electrode 160 may be formed regardless of light transmittance. As a result, degree of freedom in selection of material and determination of thickness increases and injection efficiency of electron is maximized, thereby light efficiency improved.

Since the pixel electrode 160 functions as a cathode, the low level voltage Vss is supplied to the pixel electrode 160 and the pixel electrode 160 supplies the electron to the organic emission layer 170. Since the pixel electrode 160 is divided by the separator 150 through a deposition step without an additional patterning step due to a poor step coverage property, current leakage phenomenon where the current flows through adjacent pixel regions is prevented. As a result, driving reliability is improved and accurate gray scale level is displayed.

In the first embodiment of FIG. 1, since the pixel electrode 160 is formed on the bank layer 140, an emission area may be defined by the pixel electrode 160, the organic emission layer 170 and the common electrode 180. As a result, the emission area of the OLED display device according to the first embodiment of FIG. 1 is enlarged as compared with the emission area of the OLED display device according to the related art where the emission area is defined by the open portions of the bank layer.

The organic emission layer 170 is formed on the pixel electrode 160. Since the organic emission layer 170 includes a material having a poor step coverage property, the separator 150 divides the organic emission layer 170 by pixel region through a deposition step without an additional patterning step.

The organic emission layer 170 includes a thin film of an organic material and generates a light using the electron from the pixel electrode 160 and the hole from the common electrode 180. Although not shown, the organic emission layer 170 may include an electron injection layer (EIL), an electron transport layer (ETL), an emission material layer (EML), a hole transport layer (HTL) and a hole injection layer (HIL). The electron injection layer (EIL) lowers the energy barrier between the pixel electrode 160 and the emission material layer (EML) to improve injection efficiency of the electron from the pixel electrode 160. The electron transport layer (ETL) restricts the electron transported from the pixel electrode 160 to the emission material layer (EML) to improve recombination efficiency of the electron and the hole. The emission material layer (EML) includes a thin film of an organic material of large molecule or small molecule. The hole transport layer (HTL) restricts the hole transported from the common electrode 180 to the emission material layer (EML) to improve recombination efficiency of the electron and the hole. The hole injection layer (HIL) lowers the energy barrier between the common electrode 180 and the emission material layer (EML) to improve injection efficiency of the hole from the common electrode 180.

The electron injected from the pixel electrode 160 and the hole injected from the common electrode 180 are recombined with each other in the emission material layer (EML) to generate an exciton. The exciton emits a light during a transition from an excited state to a ground state. The color of the light is determined according to a kind of the organic material for the emission material layer (EML) or an energy difference between the excited state and the ground state (i.e., a bandgap energy).

The common electrode 180 is formed on the organic emission layer 170. The common electrode 180 may include a material having a relatively high work function to supply a hole to the organic emission layer 170. For example, the common electrode 180 may include a transparent conductive oxide (TCO) such as indium tin oxide (ITO), indium zinc oxide (IZO) and indium tin zinc oxide (ITZO). Alternatively, the common electrode 180 may have a single layer or multiple layers including at least one of indium (In), silver (Ag), tin (Sn), silver tin oxide (AZO), gallium zinc oxide (GZO), zinc oxide (ZnO), indium tin oxide (ITO), indium zinc oxide (IZO) and indium tin zinc oxide (ITZO).

The common electrode 180 may further include a metal for improving electrical conductivity and for reducing resistance within an amount that does not cause reduction in transmittance. In addition, the common electrode 180 may include a conductive oxide layer contacting the organic emission layer 170. Since a work function of the conductive oxide layer is higher than a work function of the metal, the common electrode 180 may supply the hole to the organic emission layer 170 through the conductive oxide layer easily.

The common electrode 180 is electrically connected to the auxiliary electrode 132. Since the common electrode 180 includes a material having an excellent step coverage property, the common electrode 180 is deposited even on the auxiliary electrode 132 between the separator 150 and the bank layer 140. As a result, the common electrode 180 of a transparent conductive oxide is formed on an entire top surface of the substrate 110 including a side surface of the separator 150. Since the resistance of the common electrode 180 is reduced due to connection of the common electrode 180 and the auxiliary electrode 132, uniformity of brightness is improved throughout the whole OLED display device.

Figure 2:
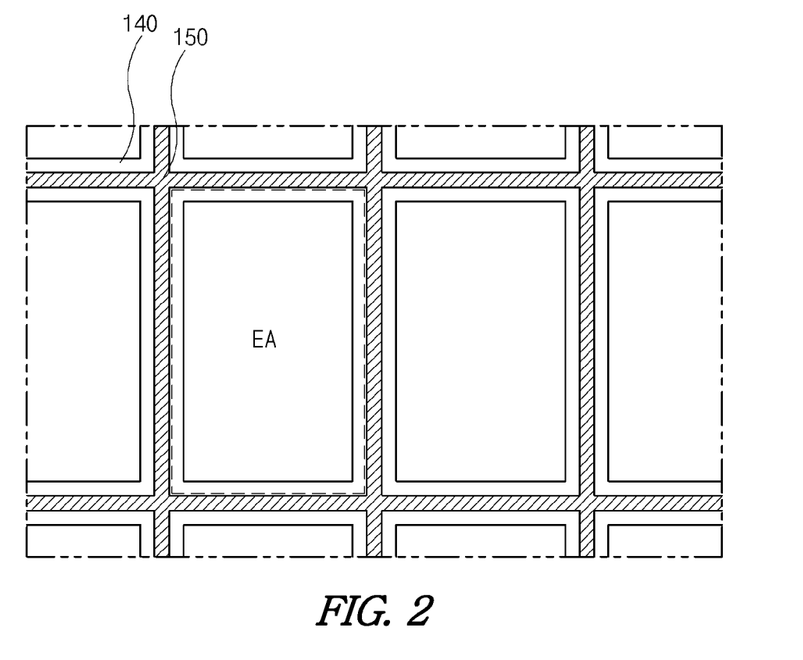
FIG. 2 is a plan view showing an organic light emitting diode display device according to a second embodiment of the present disclosure.

FIG. 2 is a plan view showing an organic light emitting diode display device according to a second embodiment of the present disclosure.

In FIG. 2, the emission area EA overlaps the bank layer 140 and the separator 150 divides the organic emission layer 170 by pixel region. As a result, the emission area EA where the pixel electrode 160, the organic emission layer 170 and the common electrode 180 are sequentially formed may be defined by the separator 150. Since the electron injected from the pixel electrode 160 and the hole injected from the common electrode 180 vertically move in the organic emission layer 170, the light is emitted from an area where the pixel electrode 160, the organic emission layer 170 and the common electrode 180 overlap each other.

Since the pixel electrode 160 is formed on the bank layer 140, the pixel electrode 160, the organic emission layer 170 and the common electrode 180 overlap each other even on the bank layer 140. As a result, the emission area EA overlaps the bank layer 140 as shown in FIG. 2.

FIGS. 3A to 3D are cross-sectional views showing a method of fabricating a light emitting diode display device according to a first embodiment of the present disclosure.

Figure 3A:
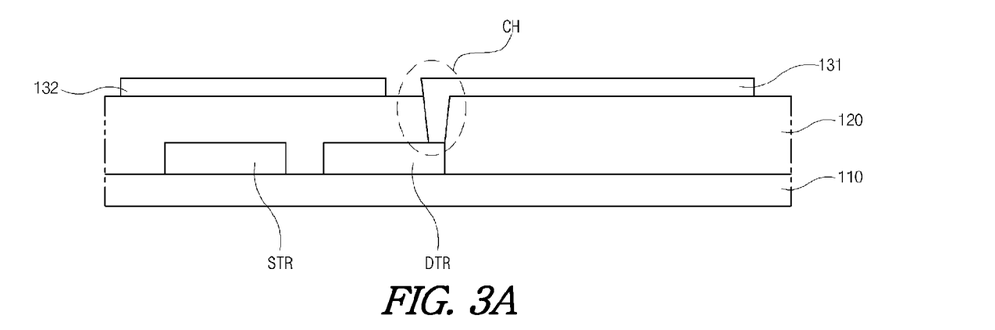
FIGS. 3A to 3D are cross-sectional views showing a method of fabricating a light emitting diode display device according to a first embodiment of the present disclosure.

In FIG. 3A, a driving circuit including the switching transistor STR and the driving transistor DTR are formed on the substrate 110. The driving circuit for driving the organic emission layer 170 may further include a conductive line of a single layer or multiple layers. For example, the conductive line of a single layer may include at least one of molybdenum (Mo), aluminum (Al), silver (Ag), chromium (Cr), gold (Au), titanium (Ti), nickel (Ni), neodymium (Nd) and copper (Cu), or alloy thereof. In addition, the conductive line of multiple layers may have at least two layers each including at least one of molybdenum (Mo), aluminum (Al), silver (Ag), chromium (Cr), gold (Au), titanium (Ti), nickel (Ni), neodymium (Nd) and copper (Cu), or alloy thereof. For example, the conductive line of multiple layers may be double layers such as molybdenum/aluminum (Mo/Al) and molybdenum/aluminum neodymium (Mo/AlNd) or triple layers such molybdenum/aluminum/molybdenum (Mo/Al/Mo) and molybdenum/aluminum neodymium/molybdenum (Mo/AlNd/Mo).

The planarization layer 120 is formed on the switching transistor STR and the driving transistor DTR to planarize the uneven top surface of the switching transistor STR and the driving transistor DTR. The planarization layer 120 has a contact hole CH exposing the driving transistor DRT. The reflective electrode 131 and the auxiliary electrode 132 are formed on the planarization layer 120. The reflective electrode 131 is connected to the driving transistor DTR through the contact hole CH.

Figure 3B:
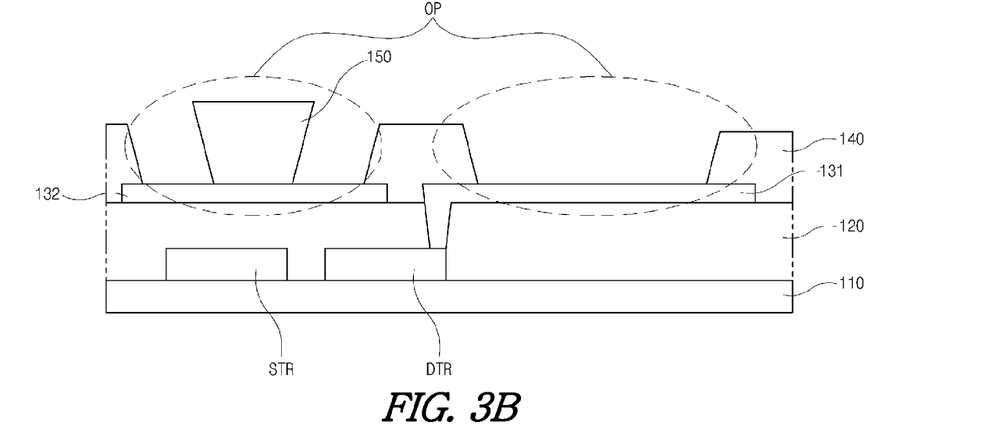

In FIG. 3B, the bank layer 140 and the separator 150 are formed on the reflective electrode 131 and the auxiliary electrode 132. The bank layer 140 and the separator 150 may be simultaneously formed. Alternatively, the bank layer 140 and the separator 150 may be formed of different materials through different fabrication steps so that the bank layer 140 and the separator 150 can have a regular taper shape and a reverse taper shape, respectively.

The bank layer 140 may include an organic material such as benzocyclobutene (BCB) resin, acrylic resin and polyimide resin, or an inorganic material such as silica. In addition, the separator 150 may include a negative type photoresist so that the reverse taper shape can be easily obtained.

The bank layer 140 has open portions (OP) exposing the reflective electrode 131 and the auxiliary electrode 132. The separator 150 is formed on the auxiliary electrode 132 exposed through the open portions (OP).

Figure 3C:
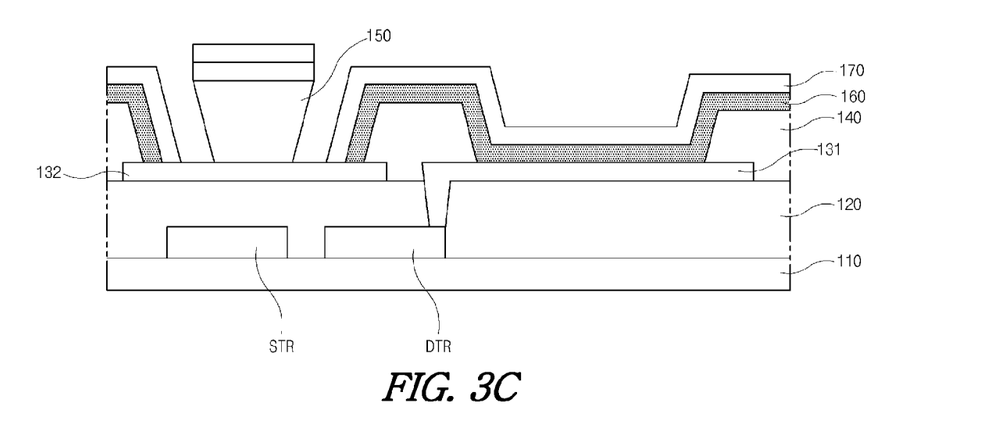

In FIG. 3C, the pixel electrode 160 and the organic emission layers 170 are sequentially formed on the reflective electrode 131 exposed through the open portions. The pixel electrode 160 and the organic emission layer 170 are divided in the gap between the separator 150 and the bank layer 140 by pixel region.

The pixel electrode 160 and the organic emission layer 170 may be formed through a vacuum deposition method or a thermal evaporation method. Since the materials for the pixel electrode 160 and the organic emission layer 170 have a poor step coverage property, the materials for the pixel electrode 160 and the organic emission layer 170 may not be formed on the side surface of the separator 150 and the auxiliary electrode 132 exposed between the separator 150 and the bank layer 140. As a result, the auxiliary electrode 132 between separator 150 and the bank 140 is not covered with the materials for the pixel electrode 160 and the organic emission layer 170 even after the steps of forming the pixel electrode 160 and the organic emission layer 170.

Figure 3D:
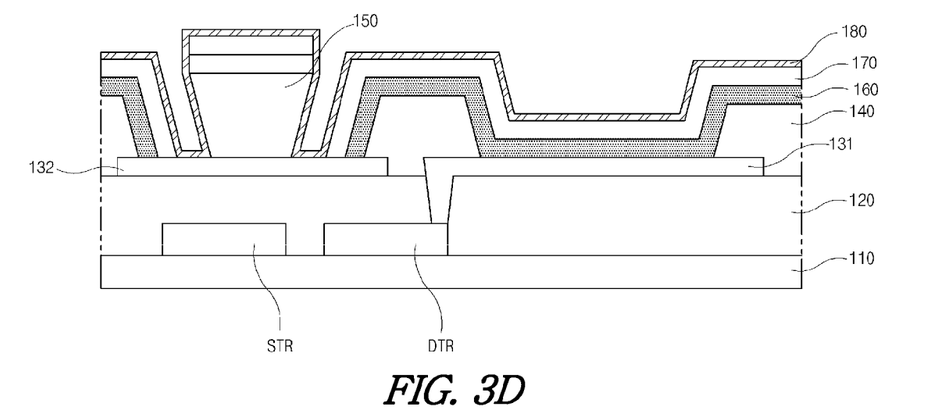

In FIG. 3D, the common electrode 180 is formed on the organic emission layer 170. The common electrode 180 may be formed through a sputtering method and may include a transparent conductive oxide (TCO). Since the transparent conductive oxide (TCO) has an excellent step coverage, the common electrode 180 may be formed on an entire top surface of the substrate 110 including the side surface of the separator 150 and the auxiliary electrode 132 exposed between the separator 150 and the bank layer 140. As a result, the common electrode 180 is connected to the auxiliary electrode 132 throughout the whole substrate 110 and the resistance of common electrode 180 is reduced.

FIGS. 4 to 8 are cross-sectional views showing organic light emitting diode display devices according to second to sixth embodiments, respectively, of the present disclosure.

Figure 4:
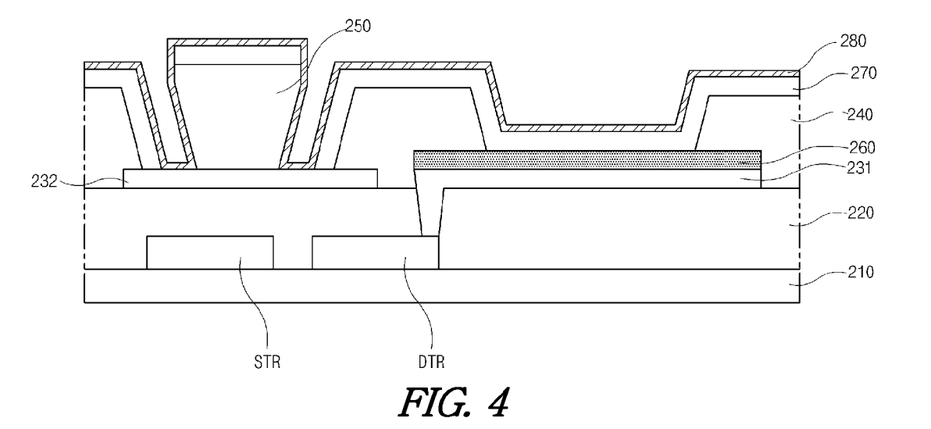
FIG. 4 is a cross-sectional view showing organic light emitting diode display devices according to a second embodiment of the present disclosure.

In FIG. 4, a pixel electrode 260 is formed under a bank layer 240, and a reflective electrode 231 and an auxiliary electrode 232 are formed on a planarization layer 220. For example, after the reflective electrode 231 and the auxiliary electrode 232 are simultaneously formed on the planarization layer 220, the pixel electrode 260 may be formed on the reflective electrode 231. The reflective electrode 231 and the auxiliary electrode 232 may have the same layer and the same material as each other. In addition, the reflective electrode 231 is connected to a driving transistor DTR.

Since the pixel electrode 260 is formed before forming the bank layer 240, an emission area is defined by open portions of the bank layer 240. In addition, since the pixel electrode 260 is separately formed in a pixel region, the current leakage phenomenon is prevented and the reliability of driving is improved.

The reflective electrode 231, the auxiliary electrode 232 and the pixel electrode 260 may be formed using first and second masks. After a first material for the reflective electrode 231 and the auxiliary electrode 232 is formed on the planarization layer 220, a first photoresist (PR) layer is formed on the first material. After the first mask is disposed over the first PR layer with alignment, a light is irradiated onto the first PR layer through the first mask. After the first PR layer is developed to form a first PR pattern, the first material is etched through a dry etching method or a wet etching method using the first PR pattern as an etching mask to form the reflective electrode 231 and the auxiliary electrode 232. Next, the first PR pattern is removed by a stripping.

Similarly, after a second material for the pixel electrode 260 is formed on the reflective electrode 231 and the auxiliary electrode 232, a second photoresist (PR) layer is formed on the second material. After the second mask is disposed over the second PR layer with alignment, a light is irradiated onto the second PR layer through the second mask. After the second PR layer is developed to form a second PR pattern, the second material is etched using the second PR pattern as an etching mask to form the pixel electrode 260. Next, the second PR pattern is removed by a stripping.

Figure 5:
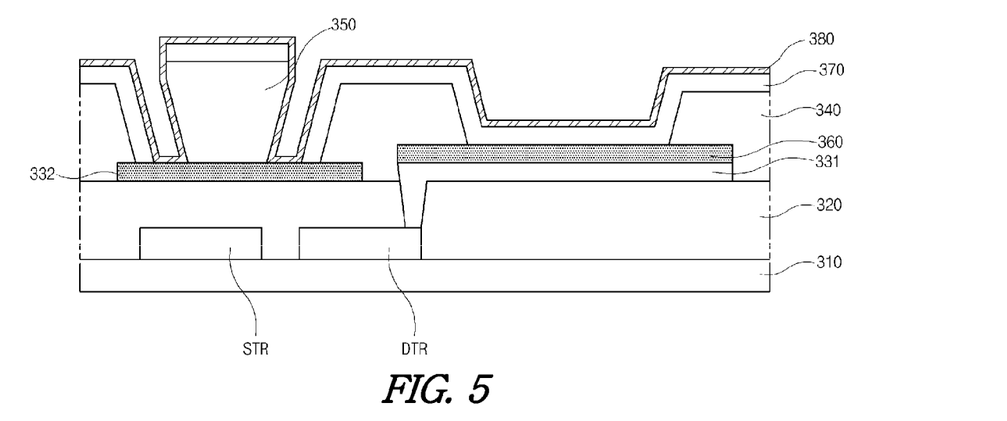
FIG. 5 is a cross-sectional view showing organic light emitting diode display devices according to a third embodiment of the present disclosure.

In FIG. 5, a pixel electrode 360 is formed under a bank layer 340, and a reflective electrode 331 and an auxiliary electrode 332 are formed on a planarization layer 320. For example, after the reflective electrode 331 is formed on the planarization layer 320, the auxiliary electrode 332 and the pixel electrode 360 may be simultaneously formed on the planarization layer 320 and the reflective electrode 331, respectively. The auxiliary electrode 332 and the pixel electrode 360 may have the same layer and the same material as each other. In addition, the reflective electrode 331 is connected to a driving transistor DTR.

Since the pixel electrode 360 is formed before forming the bank layer 340, an emission area is defined by open portions of the bank layer 340. In addition, since the pixel electrode 360 is separately formed in a pixel region, the current leakage phenomenon is prevented and the reliability of driving is improved.

The reflective electrode 331, the auxiliary electrode 332 and the pixel electrode 360 may be formed using first and second masks. After a first material for the reflective electrode 331 is formed on the planarization layer 320, a first photoresist (PR) layer is formed on the first material. After the first mask is disposed over the first PR layer with alignment, a light is irradiated onto the first PR layer through the first mask. After the first PR layer is developed to form a first PR pattern, the first material is etched through a dry etching method or a wet etching method using the first PR pattern as an etching mask to form the reflective electrode 331. Next, the first PR pattern is removed by a stripping.

Similarly, after a second material for the auxiliary electrode 332 and the pixel electrode 360 is formed on the planarization layer 320 and the reflective electrode 331, a second photoresist (PR) layer is formed on the second material. After the second mask is disposed over the second PR layer with alignment, a light is irradiated onto the second PR layer through the second mask. After the second PR layer is developed to form a second PR pattern, the second material is etched using the second PR pattern as an etching mask to form the auxiliary electrode 332 and the pixel electrode 360. Next, the second PR pattern is removed by a stripping.

Figure 6:
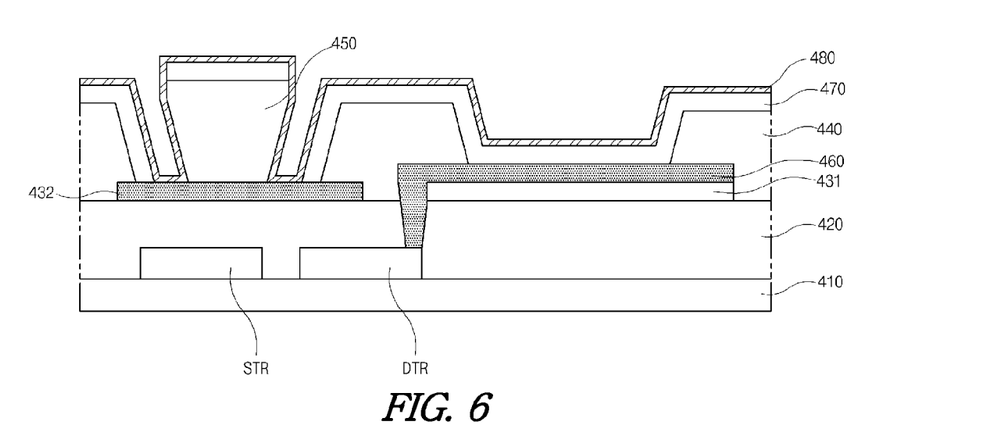
FIG. 6 is a cross-sectional view showing organic light emitting diode display devices according to a fourth embodiment of the present disclosure.

In FIG. 6, a pixel electrode 460 is formed under a bank layer 440, and a reflective electrode 431 and an auxiliary electrode 432 are formed on a planarization layer 420. For example, after the reflective electrode 431 is formed on the planarization layer 420, the planarization layer 420 may be patterned to have a contact hole exposing a driving transistor DTR. Next, the auxiliary electrode 432 and the pixel electrode 460 may be simultaneously formed on the planarization layer 420 and the reflective electrode 431, respectively. The auxiliary electrode 432 and the pixel electrode 460 may have the same layer and the same material as each other. In addition, the pixel electrode 460 is connected to the driving transistor DTR through the contact hole.

Since the pixel electrode 460 is formed before forming the bank layer 440, an emission area is defined by open portions of the bank layer 440. In addition, since the pixel electrode 460 is separately formed in a pixel region, the current leakage phenomenon is prevented and the reliability of driving is improved.

The reflective electrode 431, the auxiliary electrode 432 and the pixel electrode 460 may be formed using first and second masks. After a first material for the reflective electrode 431 is formed on the planarization layer 420, a first photoresist (PR) layer is formed on the first material. After the first mask is disposed over the first PR layer with alignment, a light is irradiated onto the first PR layer through the first mask. After the first PR layer is developed to form a first PR pattern, the first material is etched through a dry etching method or a wet etching method using the first PR pattern as an etching mask to form the reflective electrode 431. Next, the first PR pattern is removed by a stripping.

Similarly, after a second material for the auxiliary electrode 432 and the pixel electrode 460 is formed on the planarization layer 420 and the reflective electrode 431, a second photoresist (PR) layer is formed on the second material. After the second mask is disposed over the second PR layer with alignment, a light is irradiated onto the second PR layer through the second mask. After the second PR layer is developed to form a second PR pattern, the second material is etched using the second PR pattern as an etching mask to form the auxiliary electrode 432 and the pixel electrode 460. Next, the second PR pattern is removed by a stripping.

In another embodiment, the reflective electrode 431 may be omitted. The pixel electrode 460 functions as a cathode supplying an electron and is not required to transmit the light. As a result, the pixel electrode 460 may include a material having a relatively high reflectance and the reflective electrode 431 may be omitted.

Figure 7:
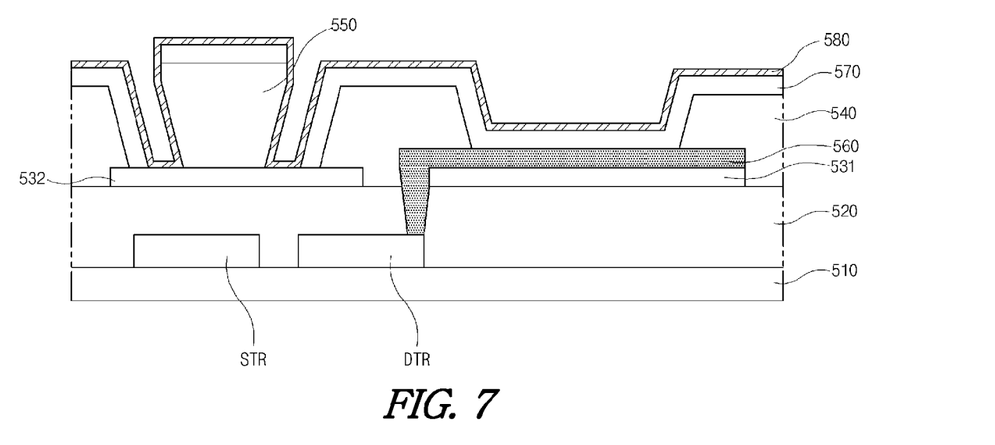
FIG. 7 is a cross-sectional view showing organic light emitting diode display devices according to a fifth embodiment of the present disclosure.

In FIG. 7, a pixel electrode 560 is formed under a bank layer 540, and a reflective electrode 531 and an auxiliary electrode 532 are formed on a planarization layer 520. For example, after the reflective electrode 531 and the auxiliary electrode 532 are simultaneously formed on the planarization layer 520, the planarization layer 520 may be patterned to have a contact hole exposing a driving transistor DTR. Next, the pixel electrode 560 may be formed on the reflective electrode 531. The reflective electrode 531 and the auxiliary electrode 532 may have the same layer and the same material as each other. In addition, the pixel electrode 560 is connected to the driving transistor DTR through the contact hole.

Since the pixel electrode 560 is formed before forming the bank layer 540, an emission area is defined by open portions of the bank layer 540. In addition, since the pixel electrode 560 is separately formed in a pixel region, the current leakage phenomenon is prevented and the reliability of driving is improved.

The reflective electrode 531, the auxiliary electrode 532 and the pixel electrode 560 may be formed using first and second masks. After a first material for the reflective electrode 531 and the auxiliary electrode 532 is formed on the planarization layer 520, a first photoresist (PR) layer is formed on the first material. After the first mask is disposed over the first PR layer with alignment, a light is irradiated onto the first PR layer through the first mask. After the first PR layer is developed to form a first PR pattern, the first material is etched through a dry etching method or a wet etching method using the first PR pattern as an etching mask to form the reflective electrode 531. Next, the first PR pattern is removed by a stripping.

Similarly, after a second material for the pixel electrode 560 is formed on the reflective electrode 531 and the auxiliary electrode 532, a second photoresist (PR) layer is formed on the second material. After the second mask is disposed over the second PR layer with alignment, a light is irradiated onto the second PR layer through the second mask. After the second PR layer is developed to form a second PR pattern, the second material is etched using the second PR pattern as an etching mask to form the pixel electrode 560. Next, the second PR pattern is removed by a stripping.

Figure 8:
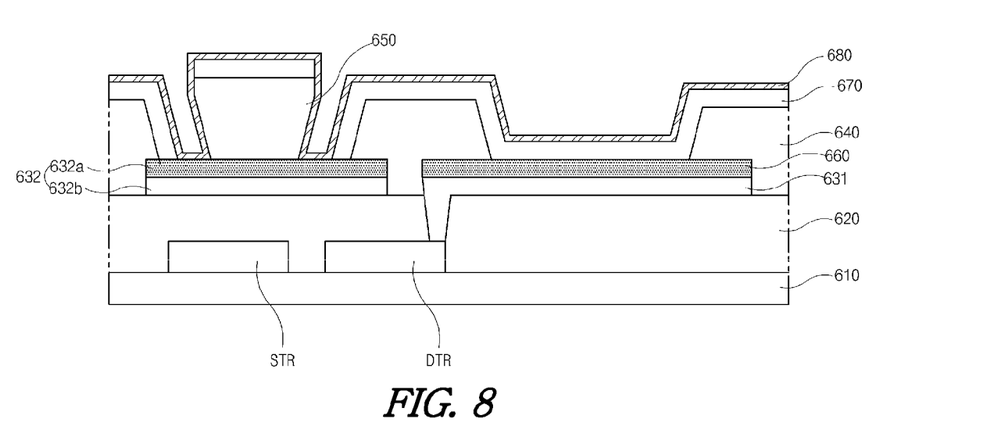
FIG. 8 is a cross-sectional view showing organic light emitting diode display devices according to a sixth embodiment of the present disclosure.

In FIG. 8, a pixel electrode 660 is formed under a bank layer 640, and a reflective electrode 631 and an auxiliary electrode 632 are formed on a planarization layer 620. The auxiliary electrode 632 includes lower and upper layers 632a and 632b. For example, after the reflective electrode 631 and the lower layer 632a of the auxiliary electrode 632 are simultaneously formed on the planarization layer 620, the upper layer 632b of the auxiliary electrode 632 and the pixel electrode 660 may be simultaneously formed on the lower layer 632a and the reflective electrode 631, respectively. The reflective electrode 631 and the lower layer 632a of the auxiliary electrode 632 may have the same layer and the same material as each other, and the pixel electrode 660 and the upper layer 632b of the auxiliary electrode 632 may have the same layer and the same material as each other. In addition, the reflective electrode 631 is connected to a driving transistor DTR. Alternatively, the pixel electrode 660 may be connected to the driving transistor DTR in another embodiment.

Since the pixel electrode 660 is formed before forming the bank layer 640, an emission area is defined by open portions of the bank layer 640. In addition, since the pixel electrode 660 is separately formed in a pixel region, the current leakage phenomenon is prevented and the reliability of driving is improved.

The reflective electrode 631, the auxiliary electrode 632 and the pixel electrode 660 may be formed using a single mask. After a first material for the reflective electrode 631 and the lower layer 632a of the auxiliary electrode 632 and a second material for the pixel electrode 660 and the upper layer 632b of the auxiliary electrode 632 are sequentially formed on the planarization layer 620, a photoresist (PR) layer is formed on the second material. After the single mask is disposed over the PR layer with alignment, a light is irradiated onto the PR layer through the single mask. After the PR layer is developed to form a PR pattern, the second material is etched through a dry etching method or a wet etching method using the PR pattern as an etching mask to form the pixel electrode 660 and the upper layer 632a of the auxiliary electrode 632. Next, the first material is etched through a dry etching method or a wet etching method using the PR pattern as an etching mask to form the reflective electrode 631 and the lower layer 632a of the auxiliary electrode 632. Next, the PR pattern is removed by a stripping.

The first material for the reflective electrode 631 and the second material for the pixel electrode 660 may be the same as each other, and the first and second materials may be etched through a dry etching method using the same etching gas or a wet etching method using the same etching solution (etchant). Alternatively, the first material for the reflective electrode 631 and the second material for the pixel electrode 660 may be different from each other, and the first and second materials may be etched through a dry etching method using different etching gases or a wet etching method using different etching solutions.

Figure 9A:
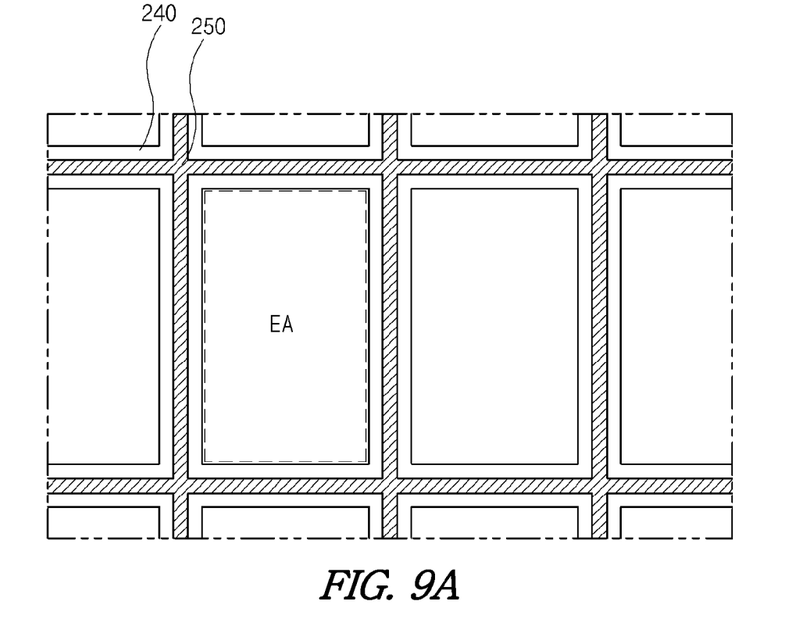
FIGS. 9A and 9B are plan views showing an organic light emitting diode display device according to each of second to sixth embodiments of the present disclosure.
Figure 9B:
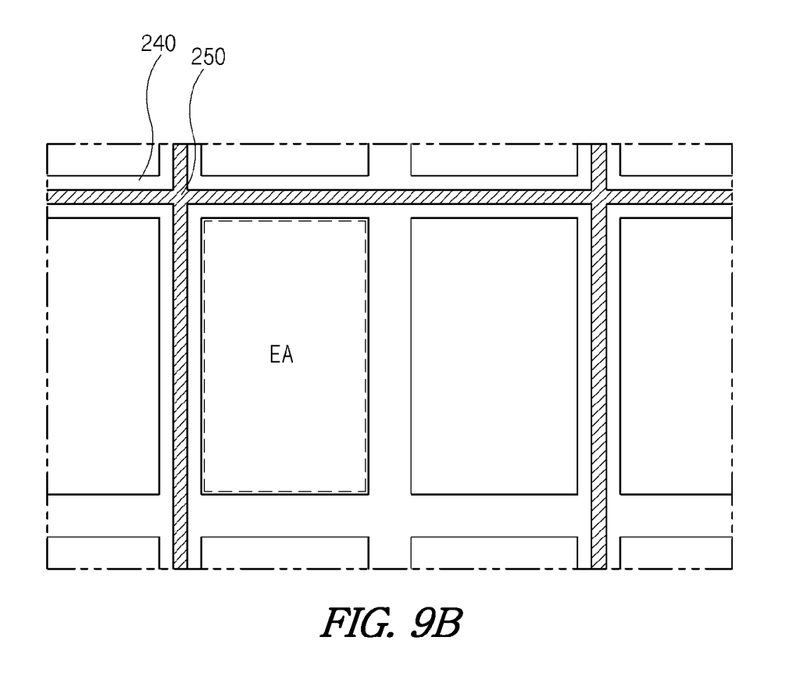

FIGS. 9A and 9B are plan views showing an organic light emitting diode display device according to each of second to sixth embodiments of the present disclosure.

In FIGS. 9A and 9B, the pixel electrode 260, 360, 460, 560 and 660 is formed under the bank layer 240, 340, 440, 540 and 640. As a result, an emission area EA where the light is emitted may be defined by open portions of the bank layer 240, 340, 440, 540 and 640.

In addition, the pixel electrode 260, 360, 460, 560 and 660 is not required to be divided by pixel region, and a separator 250, 350, 450, 550 and 650 for dividing the pixel electrode 260, 360, 460, 560 and 660 is not required to be formed at a boundary of all pixel regions. While the separator 250, 350, 450, 550 and 650 is formed at all two horizontal boundaries and all three vertical boundaries of the pixel regions in FIG. 9A, the separator 250, 350, 450, 550 and 650 is formed at one of two horizontal boundaries and two of three vertical boundaries in FIG. 9B. In another embodiment, the separator 250, 350, 450, 550 and 650 may be formed only at the horizontal boundaries or only at the vertical boundaries. Further, the separator 250, 350, 450, 550 and 650 may be formed at the alternate horizontal boundaries and the alternate vertical boundaries. In addition, the separator 250, 350, 450, 550 and 650 may be randomly formed at the horizontal boundaries and the vertical boundaries.

Since the position of the separator 250, 350, 450, 550 and 650 is the same as the position where the common electrode 280, 380, 480, 580 and 680 and the auxiliary electrode 232, 332, 432, 532 and 632 are connected, the position of the separator 250, 350, 450, 550 and 650 may be determined on the basis of resistance reduction effect for the common electrode 280, 380, 480, 580 and 680. Since the resistance reduction effect increases according to increase of the contact area where the common electrode 280, 380, 480, 580 and 680 and the auxiliary electrode 232, 332, 432, 532 and 632 are connected, an area for the separator 250, 350, 450, 550 and 650 may be minimized to obtain sufficient resistance reduction effect.

Consequently, in the top emission type OLED display device of the present disclosure, since the anode is disposed at the upper portion as the common electrode and the cathode is disposed at the lower portion as the pixel electrode, the light emitted from the organic emission layer is transmitted through the transparent anode. As a result, brightness of the OLED display device is improved.

In addition, since the cathode is divided by pixel region, the current leakage phenomenon where the current flows through adjacent pixel regions is prevented.

Further, the cathode is divided by the separator at the boundary of the pixel region, the cathode is divided by the separator without an additional patterning step.

Moreover, since the cathode is disposed in the pixel region, degrees of freedom in selection of material and determination of thickness increase and injection efficiency of electron is maximized. As a result, light efficiency is improved.

It will be apparent to those skilled in the art that various modifications and variations can be made in an organic light emitting diode display device of the present disclosure without departing from the sprit or scope of the disclosure. Thus, it is intended that the present disclosure covers the modifications and variations of these embodiments provided they come within the scope of the appended claims and their equivalents.

What is claimed is:

1. An organic light emitting diode display device, comprising:
   a reflective electrode;

an auxiliary electrode;
a bank layer on the reflective electrode and the auxiliary electrode, the bank layer including a first open portion and a second open portion exposing a portion of the reflective electrode and a portion of the auxiliary electrode, respectively;
a separator on the auxiliary electrode, the separator disposed within the second open portion;
a pixel electrode in contact with the portion of the reflective electrode exposed by the first open portion of the bank layer, the pixel electrode being disposed separated from the separator, the pixel electrode overlapping the bank layer;
an organic emission layer on the pixel electrode and overlapping the bank layer, the organic emission layer divided by the separator, the organic emission layer being disposed separated from the separator; and
a common electrode on the organic emission layer, the common electrode connected to the auxiliary electrode.

2. The organic light emitting diode display device according to claim 1, further comprising a thin film transistor on a substrate, wherein the reflective electrode is connected to the thin film transistor.

3. The organic light emitting diode display device according to claim 1, wherein the reflective electrode and the auxiliary electrode are coplanar within the display device, the reflective electrode and the auxiliary electrode fabricated from a same material.

4. The organic light emitting diode display device according to claim 1, wherein the auxiliary electrode is fabricated from a same material as the pixel electrode.

5. The organic light emitting diode display device according to claim 1, wherein the auxiliary electrode is fabricated from a same material as the reflective electrode.

6. The organic light emitting diode display device according to claim 1, wherein the reflective electrode is in contact with a driving transistor.

7. The organic light emitting diode display device according to claim 1, wherein the pixel electrode is in contact with a driving transistor.

8. The organic light emitting diode display device according to claim 1, wherein the separator has a reverse tapered shape that is narrower at a bottom than at a top.

9. The organic light emitting diode display device according to claim 1, wherein a work function of the common electrode is greater than a work function of the pixel electrode.

10. The organic light emitting diode display device according to claim 1, wherein a low level voltage is supplied to the pixel electrode and a high level voltage is supplied to the common electrode.

11. The organic light emitting diode display device according to claim 1, wherein the common electrode is connected to the portion of the auxiliary electrode exposed by the second open portion between the separator and the bank layer.

12. The organic light emitting diode display device according to claim 1, wherein the pixel electrode includes a metal layer contacting the organic emission layer.

13. The organic light emitting diode display device according to claim 1, wherein the common electrode includes a conductive oxide layer contacting the organic emission layer.

14. An organic light emitting diode display device, comprising:
a pixel electrode;
an auxiliary electrode;
a bank layer on the auxiliary electrode, the bank layer including an open portion exposing a portion of the auxiliary electrode respectively;
a separator in contact with the auxiliary electrode, the separator disposed within the open portion;
an organic emission layer in contact with the pixel electrode, both of the organic emission layer and the pixel electrode overlapping the bank layer, the organic emission layer being disposed separated from the separator; and
a common electrode on the organic emission layer, the common electrode connected to the auxiliary electrode.

15. The organic light emitting diode display device according to claim 14, further comprising a reflective electrode under the pixel electrode.

16. The organic light emitting diode display device according to claim 15, further comprising a thin film transistor on a substrate, wherein one of the pixel electrode and the reflective electrode is connected to the thin film transistor.

17. The organic light emitting diode display device according to claim 15, wherein one of the pixel electrode and the reflective electrode is coplanar with the auxiliary electrode within the display device.

18. The organic light emitting diode display device according to claim 15, wherein one of the pixel electrode and the reflective electrode is fabricated from a same material as the auxiliary electrode.

19. The organic light emitting diode display device according to claim 14 wherein the separator has a reverse taper shape.

20. The organic light emitting diode display device according to claim 14, wherein a work function of the common electrode is greater than a work function of the pixel electrode.

21. An organic light emitting diode display device, comprising:
a pixel electrode;
an auxiliary electrode;
a bank layer over the auxiliary electrode, the bank layer defining;
an opening exposing a portion of the auxiliary electrode;
an organic emission layer in contact with the pixel electrode, the organic emission layer and the pixel electrode overlapping the bank layer; and
a common electrode over the organic emission layer and in contact with the auxiliary electrode in the opening, the auxiliary electrode reducing an electrical resistance of the common electrode.

22. The organic light emitting diode display device of claim 21, further comprising a separator disposed in the opening between the auxiliary electrode and the common electrode, the common electrode connected to the auxiliary electrode between the separator and the bank layer.

23. The organic light emitting diode display device of claim 21, wherein the organic emission layer is disposed in contact with the auxiliary electrode in the opening.

24. The organic light emitting diode display device of claim 21, further comprising a reflective electrode in contact with the pixel electrode on a side opposite the organic emission layer.

25. The organic light emitting diode display device of claim 24, wherein the auxiliary electrode and the reflective electrode are coplanar.

* * * * *